(12) United States Patent
Katou

(10) Patent No.: US 8,599,605 B2
(45) Date of Patent: Dec. 3, 2013

(54) MAGNETIC STORAGE DEVICE

(75) Inventor: Yuukou Katou, Tokyo (JP)

(73) Assignee: NEC Corporation, Tokyo (JP)

( * ) Notice: Subject to any disclaimer, the term of this patent is extended or adjusted under 35 U.S.C. 154(b) by 145 days.

(21) Appl. No.: 12/602,234

(22) PCT Filed: May 15, 2008

(86) PCT No.: PCT/JP2008/058924
§ 371 (c)(1),
(2), (4) Date: Jan. 10, 2010

(87) PCT Pub. No.: WO2008/146610
PCT Pub. Date: Dec. 4, 2008

(65) Prior Publication Data
US 2010/0173173 A1    Jul. 8, 2010

(30) Foreign Application Priority Data

May 28, 2007  (JP) .................................. 2007-140176

(51) Int. Cl.
*G11C 11/00* (2006.01)
(52) U.S. Cl.
USPC .......................... 365/158; 365/171; 360/319
(58) Field of Classification Search
USPC .......... 365/158, 171, 173, 148, 163; 360/319, 360/324, 235, 257; 428/800
See application file for complete search history.

(56) References Cited

U.S. PATENT DOCUMENTS

| | | | | |
|---|---|---|---|---|
| 6,812,537 | B2 * | 11/2004 | Okazawa et al. | 257/421 |
| 7,184,301 | B2 * | 2/2007 | Sugibayashi et al. | 365/158 |
| 2002/0036877 | A1 | 3/2002 | Sakakima et al. | |

(Continued)

FOREIGN PATENT DOCUMENTS

| | | | |
|---|---|---|---|
| JP | 2001267522 A | 9/2001 |
| JP | 2001284550 A | 10/2001 |

(Continued)

OTHER PUBLICATIONS

International Search Report for PCT/JP2008/058924 mailed Aug. 26, 2008.

(Continued)

*Primary Examiner* — Dang Nguyen

(57) ABSTRACT

A magnetic storage device includes a laminated structure and a third magnetic body. The laminated structure includes a first magnetic body, a nonmagnetic body, and a second magnetic body which are laminated. The third magnetic body is provided at any of a first magnetic body side and a second magnetic body side. Resistance of the laminated structure is changed based on a difference between magnetization directions of the first magnetic body and the second magnetic body. A projection of the third magnetic body onto the first magnetic body at least partly overlaps the first magnetic body. The first magnetic body and the third magnetic body are magnetically coupled. A planar shape of the first magnetic body is a shape that is long in a first direction. A length of the third magnetic body is shorter than a length of the first magnetic body in the first direction. An aspect ratio of a length of a long-axis direction of the planar shape of the first magnetic body divided by a length of a short-axis direction is greater than an aspect ratio of a length of a long-axis direction of a planar shape of the third magnetic body divided by a length of a short-axis direction.

18 Claims, 12 Drawing Sheets

(56) References Cited

U.S. PATENT DOCUMENTS

| | | |
|---|---|---|
| 2003/0185050 A1* | 10/2003 | Kishi et al. .................... 365/173 |
| 2005/0057960 A1 | 3/2005 | Saito et al. |
| 2005/0068695 A1 | 3/2005 | Djayaprawira et al. |
| 2006/0250840 A1* | 11/2006 | Zheng et al. .................. 365/171 |
| 2007/0007610 A1 | 1/2007 | Saito et al. |
| 2007/0097742 A1 | 5/2007 | Fujiwara et al. |
| 2007/0201168 A1 | 8/2007 | Sugibayashi et al. |

FOREIGN PATENT DOCUMENTS

| | | |
|---|---|---|
| JP | 2002084019 A | 3/2002 |
| JP | 2004193595 A | 7/2004 |
| JP | 2005044490 A | 2/2005 |
| JP | 2005085951 A | 3/2005 |
| JP | 2005150303 A | 6/2005 |
| JP | 2005327988 A | 11/2005 |
| JP | 2006060003 A | 3/2006 |
| JP | 2006073861 A | 3/2006 |
| JP | 2006165265 A | 6/2006 |
| JP | 2006352062 A | 12/2006 |
| WO | 2005098953 A | 10/2005 |

OTHER PUBLICATIONS

R. Scheuerlein et al., "A 10ns Read and Write Non-Volatile Memory Array Using a Magnetic Tunnel Junction and FET Switch in each Cell", IEEE International Solid-State Circuits Conference, Digest of Technical Papers, TA 7.2, 2000, p. 128-129.

M. Durlam et al., "Nonvolatile RAM based on Magnetic Tunnel Junction Elements", IEEE International Solid-State Circuits Conference, Digest of Technical Papers, 2000, p. 130-131.

US Office Action for U.S. Appl. No. 12/528,393 issued Mar. 27, 2012.

Non-Final Office Action for U.S. Appl. No. 12/528,393 mailed on Jul. 10, 2013.

* cited by examiner

MAGNETIC STORAGE DEVICE

TECHNICAL FIELD

The present invention relates to a magnetic storage device, and in particular, relates to a magnetic storage device using a storage element with shape anisotropy.

BACKGROUND ART

As magnetic storage devices, a memory composed of magnetoresistive elements as storage elements, is known for example.

As an example of the magnetoresistive element, a structure called Tunneling Magnetroregistance (hereinafter referred to as TMR) in which a tunnel insulating film is put between two magnetic bodies, will be described. FIG. 1 is a sectional view showing an example of a TMR element reported by Roy Scheuerlein, et al., "A 10 ns Read and Write Non-Volatile Memory Array Using a Magnetic Tunnel Junction and FET Switch in each Cell", 2000 IEEE International Solid-State Circuits Conference DIGEST OF TECHNICAL PAPERS (p. 128). This TMR element includes an antiferromagnetic layer 201, a pinned layer 202, a tunnel insulating layer 203, and a ferromagnetic free layer 204, which are laminated. The antiferromagnetic layer 201 is composed of FeMn (10 nm). The ferromagnetic pinned layer 202 is composed of CoFe (2.4 nm). The tunnel insulating layer 203 is composed of Al2O3. The ferromagnetic free layer 204 is composed of NiFe (5 nm). Conductive wiring lines are respectively connected to the antiferromagnetic layer 201 and the free layer 204 such that voltage can be applied thereto. A magnetization direction of the pinned layer 202 is fixed to a certain direction by the antiferromagnetic layer 201. The free layer 204 is formed to easily be magnetized in a certain direction, and the magnetization direction can be changed by externally applying a magnetic field. Among horizontal directions of a film of the free layer 204, a direction into which magnetization is easy is referred to as an easy axis while a direction which is perpendicular to the easy axis and into which magnetization is hard is referred to as a hard axis. An electric current flows through the tunnel insulating film 203 when applying voltage between the free layer 204 and the pinned layer 202, and a resistance value changes depending on the relationship between the magnetization directions of the free layer 204 and the pinned layer 202. That is to say, resistance is low when the magnetization directions are the same while resistance is high when the magnetization directions are opposite directions.

Next, a nonvolatile memory (magnetic storage device) that uses a TMR element as a storage element will be described. FIG. 2 is a perspective view showing an example of a nonvolatile memory reported by M. Durlam, et al., "Nonvolatile RAM based on Magnetic Tunnel Junction Elements", 2000 IEEE International Solid-State Circuits Conference DIGEST OF TECHNICAL PAPERS (p. 130). This nonvolatile memory 210 is provided with a pair of wiring lines intersecting above and below each of TMR elements 205 arranged in the form of an array. Upper wiring lines 206 are connected to free layers of the TMR elements 205. Antiferromagnetic layers of the TMR elements 205 are connected to drains of transistors 208 formed in a lower layer through third wiring lines 207. A current is flowed through two wiring lines B (any of B1 to B4) and D (any of D1 to D4) to generate a synthetic magnetic field in the vicinity of the intersection, and a magnetization direction of a free layer is set depending on a direction of the current. Consequently, a resistance value of the TMR element 205 can be changed. Data read can be performed as follows. First, the transistor 208 connected to the TMR element 205 for read is turned to the on state by a wiring lines W. Next, voltage is applied to the TMR element 205 from the wiring line B. Consequently, a current flows through the TMR element 205. Read is performed by evaluating a resistance value of the TMR element 205 with the flowing current.

As a shape of a plane of the aforementioned free layer, a shape that is long in one direction such as an elliptic shape and a rectangular shape is generally used. In such a shape that is long in one direction, an axis into which magnetization is easy, i.e. an easy axis, is formed in the long direction due to shape anisotropy of a magnetic body. A storage element can generate two magnetization states depending on which the magnetization direction of the magnetic body is directed to in the easy axis. A magnetic field that reverses a direction of magnetization is sensitive to shape anisotropy, i.e. a shape of a free layer. In a nonvolatile memory that uses a large number of magnetic storage elements for memory cells however, forming free layers of the same shapes is more difficult as memory cells are miniaturized. As a result, variation is caused in the shapes of the individual free layers and the variation may cause variation in switching fields. In particular, as change in a magnetization direction of a part along a long side is prevented and a magnetic field required for magnetization switching becomes larger, variation is likely to be caused when deformation is present in a pattern of this part. As mentioned above, the disclosed magnetic storage device has a problem that a switching field is large and prevention of variation in switching fields tends to be difficult.

Japanese Laid-Open Patent Application JP-P2001-267522A (corresponding U.S. Pat. No. 6,396,735 (B2)) discloses a magnetic memory element and a magnetic memory. In the magnetic memory element, at least a first magnetic layer, a nonmagnetic layer, and a second magnetic layer are laminated. The magnetic memory element is provided with a third magnetic layer through at least one conductive layer on a side different from the side where the nonmagnetic layer is laminated of the first or second magnetic layer.

Japanese Laid-open Patent Application JP-P2005-85951A discloses a magnetic storage element and a magnetic memory. The magnetic storage element at least includes a storage layer for retaining information based on magnetization states of a magnetic body, and an auxiliary magnetic layer in which a magnetization state changes due to external a magnetic field. The auxiliary magnetic layer includes a plurality of magnetic layers divided by nonmagnetic layers. Magnetic interaction in which magnetizations run antiparallel is present between adjacent magnetic layers of the auxiliary magnetic layer. The total magnetization amount of the even-numbered magnetic layers of the auxiliary magnetic layer and the total magnetization amount of the odd-numbered magnetic layers of the auxiliary magnetic layer are approximately equal.

Japanese Laid-Open Patent Application JP-P2006-352062A discloses a magnetoresistive device and a magnetic memory using the magnetoresistive device. The magnetoresistive element includes a free magnetization layer capable of magnetization switching, and a fixed magnetization layer in which magnetization is fixed. The free magnetization layer includes a plurality of ferromagnetic layers and includes a first antiparallel-coupling synthetic ferrimagnetic structure formed such that two adjacent ferromagnetic layers of the plurality of ferromagnetic layers are antiparallel coupled through a nonmagnetic layer, and a first switching induction layer showing ferromagnetism. The first switching induction layer is formed such that the first switching induction layer is ferromagnetically coupled with the first antiparallel-coupling synthetic ferrimagnetic structure and such that a switching field is smaller than a magnetic field in which the antiparallel coupling of the first antiparallel-coupling synthetic ferrimagnetic structure begins to come off.

DISCLOSURE OF INVENTION

An object of the present invention is to provide a magnetic storage device which can make a switching field of a magnetic body of a magnetoresistive storage element smaller and reduce effect to variation in switching fields caused by variation in shapes.

A magnetic storage device of the present invention includes a laminated structure including a first magnetic body, a nonmagnetic body, and a second magnetic body which are laminated, and a third magnetic body provided at any of a side of the first magnetic body and a side of the second magnetic body. Resistance of the laminated structure is changed based on a difference between magnetization directions of the first magnetic body and the second magnetic body. A projection of the third magnetic body onto the first magnetic body at least partly overlaps the first magnetic body. The first magnetic body and the third magnetic body are magnetically coupled. A planar shape of the first magnetic body is a shape that is long in a first direction. In the first direction, a length of the third magnetic body is shorter than a length of the first magnetic body. An aspect ratio of a length of a long-axis direction of the planar shape of the first magnetic body divided by a length of a short-axis direction is greater than an aspect ratio of a length of a long-axis direction of a planar shape of the third magnetic body divided by a length of a short-axis direction.

A magnetic storage device of the present invention includes a laminated structure including a first magnetic body, a nonmagnetic body, and a second magnetic body which are laminated, and a third magnetic body provided at any of a side of the first magnetic body and a side of the second magnetic body. Resistance of the laminated structure is changed based on a difference between magnetization directions of the first magnetic body and the second magnetic body. A projection of the first magnetic body onto the third magnetic body at least partly overlaps the third magnetic body. The third magnetic body and the first magnetic body are magnetically coupled. A planar shape of the third magnetic body is a shape that is long in a first direction. In the first direction, a length of the first magnetic body is shorter than a length of the third magnetic body. An aspect ratio of a length of a long-axis direction of the planar shape of the third magnetic body divided by a length of a short-axis direction is greater than an aspect ratio of a length of a long-axis direction of a planar shape of the first magnetic body divided by a length of a short-axis direction.

BEST MODE FOR CARRYING OUT THE INVENTION

Exemplary embodiments of a magnetic storage device according to the present invention will be described below with reference to the attached drawings.

Figure 1:
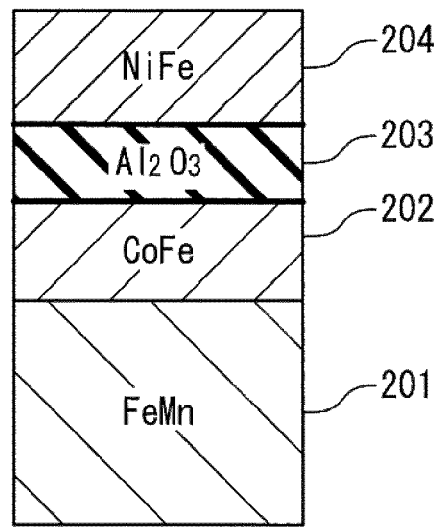
FIG. 1 is a sectional view showing a reported example of a TMR element.
Figure 2:
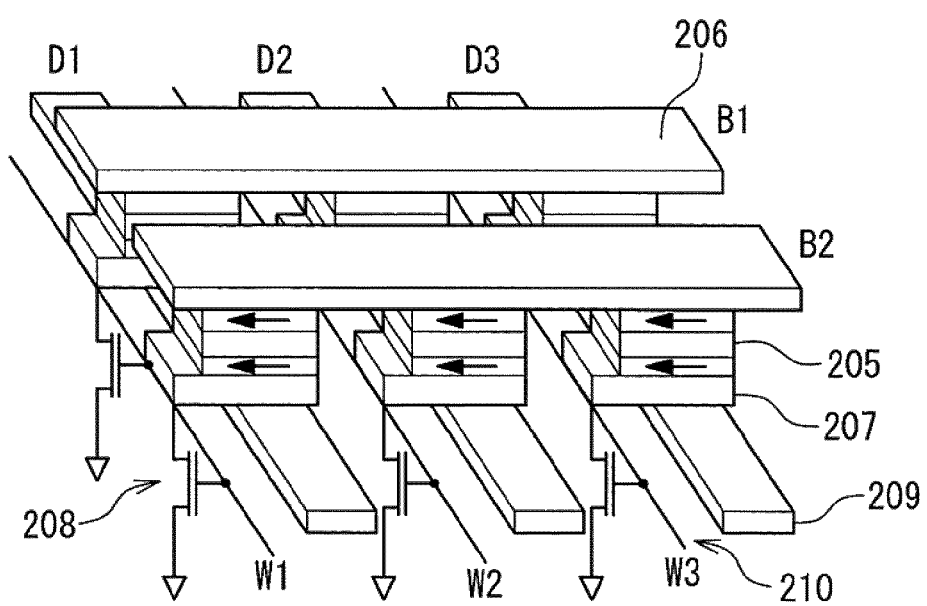
FIG. 2 is a perspective view showing a reported example of a nonvolatile memory.
Figure 3:
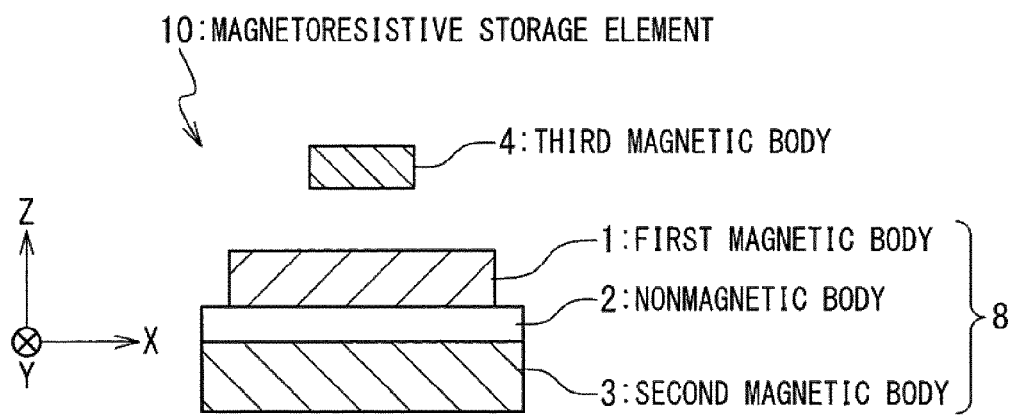
FIG. 3 is a sectional view showing a primary part of a magnetoresistive storage element of a magnetic storage device according to an exemplary embodiment of the present invention.
Figure 4:
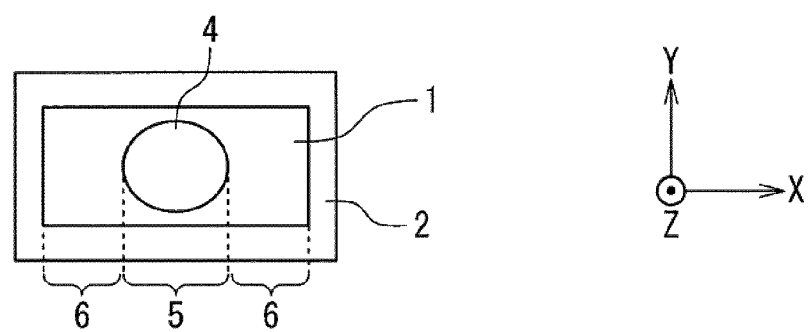
FIG. 4 is a plan view showing the primary part of the magnetoresistive storage element of the magnetic storage device according to the exemplary embodiment of the present invention.

FIG. 3 is a sectional view showing a primary part of a magnetoresistive storage element of a magnetic storage device according to an exemplary embodiment of the present invention. FIG. 4 is a plan view showing the primary part of the magnetoresistive storage element of the magnetic storage device according to the exemplary embodiment of the present invention.

A magnetoresistive storage element 10 includes a laminated structure 8 in which a first magnetic body 1, a nonmagnetic body 2, and a second magnetic body 3 are laminated; and a third magnetic body 4 opposed to the first magnetic body 1. The first magnetic body 1 and the third magnetic body 4 are magnetically coupled, and may be in contact with each other or may be separately provided each other. Magnetic coupling is exemplified by antiferromagnetic coupling, ferromagnetic coupling, and coupling through a fringing field of an end.

The first magnetic body 1 is a free layer in a TMR element. A planar shape thereof (XY planar shape) is a shape that is long in one direction (X direction). The second magnetic body 3 is a pinned layer in the TMR element. A planar shape thereof (XY planar shape) is the same shape as the first magnetic body 1 or a shape that includes the whole first magnetic body 1. The nonmagnetic body 2 is provided between the first magnetic body 1 and the second magnetic body 3. The nonmagnetic body 2 is a barrier layer in the TMR element. A planar shape thereof (XY planar shape) is the same shape as the first magnetic body 1 or the same shape as the second magnetic body 3.

In the long-side direction (X direction) of the first magnetic body 1, a planar shape (XY planar shape) of the third magnetic body 4 is shorter than the first magnetic body 1. For this reason, the first magnetic body 1 has a region 5 which overlaps the third magnetic body 4 and a region 6 which does not overlap the third magnetic body 4 on a plane, when the third magnetic body 4 is thrown (projected) onto the plane (XY plane) of the first magnetic body 1. An aspect ratio of the length of a long axis in the planar shape (XY planar shape) of the third magnetic body 4 divided by the length of a short axis is smaller than an aspect ratio of the length of a long axis in the planar shape (XY planar shape) of the first magnetic body 1 divided by the length of a short axis. As for a direction different from the long axis direction of the first magnetic body 1, the length of the third magnetic body 4 may be shorter or longer than the length of the first magnetic body 1. Additionally, the long axis direction of the first magnetic body 1 and the long axis direction of the third magnetic body 4 may be different.

The first magnetic body 1 of the magnetoresistive storage element 10 of the magnetic storage device has a planar shape that is long in one direction (X direction). That is to say, the shape has a large aspect ratio. For this reason, an easy axis, which is a directional axis into which magnetization is easy, is formed due to shape anisotropy. In this case, the easy axis is formed in the X direction. Therefore, an anisotropic magnetic field is large and a magnetization direction changes in a large magnetic field. On the other hand, the third magnetic body 4 has a shape with a small aspect ratio, compared with the first magnetic body 1. Therefore, an anisotropic magnetic field is small and change in a magnetization direction occurs in a relatively-small magnetic field. That is to say, a magnetization switching field of the third magnetic body 4 is smaller than the magnetization switching field of the first magnetic body 1.

Since the magnetization switching field of the third magnetic body 4 is smaller than the magnetization switching field of the first magnetic body 1, a magnetization direction of the first magnetic body 4 firstly changes when a magnetic field is applied to the magnetoresistive storage element 10. At this time, the third magnetic body 4 can give force to help the magnetization direction of the first magnetic body 1 change since the first magnetic body 1 and the third magnetic body 4 are magnetically coupled. Therefore, the magnetization direction of the first magnetic body 1 can be changed surely.

The nonmagnetic body 2 is such a tunnel insulator as a thin-film MgO and such a conductive material as Cu, for example. Each of the first magnetic body 1, the second magnetic body 3, and the third magnetic body 4 may be any of a single magnetic body layer, a plurality of magnetic body layers, and a plurality of magnetic body layers in which each of nonmagnetic conductors is provided between two magnetic body layers anti ferromagnetically or ferromagnetically-coupled with each other.

Next, an operation method of the magnetic storage device will be described.

First, data write operation will be described. Firstly, a magnetic field having a component in an easy axis direction of the first magnetic body 1 is externally given to the magnetoresistive storage element 10. In the third magnetic body 4, which has a smaller aspect ratio and a smaller anisotropic magnetic field compared with the first magnetic body 1, a magnetization direction is changed in a small magnetic field. Here, the third magnetic body 4 gives force to help the magnetization direction of the first magnetic body 1 change since the first magnetic body 1 and the third magnetic body 4 are magnetically coupled. For example, when the first magnetic body 1 and the third magnetic body 4 are antiferromagnetically or ferromagnetically coupled, magnetic force is transmitted from the third magnetic body 4, in which change in a magnetization direction has already begun, into a direction to which the magnetization direction of the first magnetic body 1 changes. When the first magnetic body 1 and the third magnetic body 4 are coupled through a fringing field generated from an end of a pattern for example, the magnetization direction of the third magnetic body 4 which changes first becomes a direction that offsets the fringing magnetic field as a result of change in the magnetization direction of the first magnetic body 1. That is to say, the magnetization direction of the third magnetic body 4 and the magnetization direction of the first magnetic body 1 are approximately the opposite directions.

By applying a magnetic field of sufficient magnitude thereafter, the magnetization direction of the first magnetic body 1 can be directed toward a direction of the applied magnetic field. As a result, the magnetization direction of the first magnetic body 1 can be set to a desired direction of an easy axis by controlling the direction of the magnetic field to be applied. That is to say, data can be written into the magnetoresistive storage element 10.

At this time, since the third magnetic body 4 can help the magnetization direction of the first magnetic body 1 change, a switching magnetic field of the first magnetic body 1 can be smaller and the effect to variation in switching magnetic fields due to variation in shapes can be reduced, compared with the case where the third magnetic body 4 is not provided. As a result, a magnetization direction can be changed more surely.

Next, data read operation will be described. First, a magnetization direction of the second magnetic body 3 is set to a desired direction. Consequently, a resistance value of the magnetoresistive storage element 10 changes due to the difference between a magnetization direction of the first magnetic body 1 and a magnetization direction of the second magnetic body 3 (relative direction relationship). By evaluating the difference in the resistance values, data can be read from the magnetoresistive storage element 10.

Additionally, setting of a magnetization direction of the second magnetic body 3 at the time of the read operation may be performed at the time of the read operation, or may be performed by a means to direct a magnetization direction toward a desired direction provided at the time of manufacturing.

The third magnetic body 4 has a structure in which a plurality of magnetic bodies are antiferromagnetically coupled or ferromagnetically coupled through nonmagnetic bodies put between the magnetic bodies. In the third magnetic body 4, at least one of sets, each of which includes the magnetic body, the nonmagnetic body, and the magnetic body, is antiferromagnetically coupled. In the third magnetic body 4, magnetization switching does not occur even when a unidirectional magnetic field is applied when film configuration makes the entire magnetization amount approximately zero. In this case, proper operation can be obtained by setting antiferromagnetic coupling such that the magnetization direction comes off opposite direction in at least one of the sets of magnetic bodies antiferromagnetically coupled in a magnetic field smaller than a switching magnetic field of the first magnetic body 1.

In the case where the first magnetic body 1 and the third magnetic body 4 are antiferromagnetically coupled or ferromagnetically coupled, a magnetization direction of the first magnetic body 1 on the side of the third magnetic body 4, a magnetization direction of the third magnetic body 4 on the side of the first magnetic body 1, and a magnetic coupling direction make energy small, when a write magnetic field is applied.

The following toggle write method is exemplified as a write method in a case where the first magnetic body 1 is a laminated configuration including a magnetic body, a nonmagnetic body, and a magnetic body, the magnetic bodies are antiferromagnetically coupled, and the film thicknesses of the magnetic bodies are adjusted such that the entire magnetization amount is approximately zero. That is to say, a first magnetic field of appropriate magnitude in a direction of an anisotropic magnetic field of the first magnetic body 1, and a second magnetic field of appropriate magnitude perpendicular to the former are prepared. The second magnetic field is applied first, the first magnetic field is applied thereafter, the second magnetic field is stopped next, and the first magnetic field is stopped finally. This makes it possible to switch a magnetization direction from the original direction to the opposite direction.

In the present exemplary embodiment, force to induce magnetization change works from the third magnetic body 4 in which magnetization change occurs in a small magnetic field, to the first magnetic body 1. For this reason, a magnetic field required for magnetization switching of the first magnetic body 1 may be small. In particular, since the third magnetic body 4 is opposite the vicinity of a long side where change in a magnetization direction is less likely to occur in the first magnetic body 1 that is long in one direction and induces change in a magnetization direction, variation in switching fields caused by irregularity in pattern shapes in the vicinity of long sides can be reduced. Additionally, since the first magnetic body 1 has a region that is not opposite the third magnetic body 4, shape anisotropy of the first magnetic body 1 is maintained and resistance to thermal disturbance can be secured. Therefore, a memory array with a small write current and small variation in write currents can be formed by preparing a plurality of magnetoresistive storage elements according to the exemplary embodiment of the present invention and controlling write and read.

Figure 5:
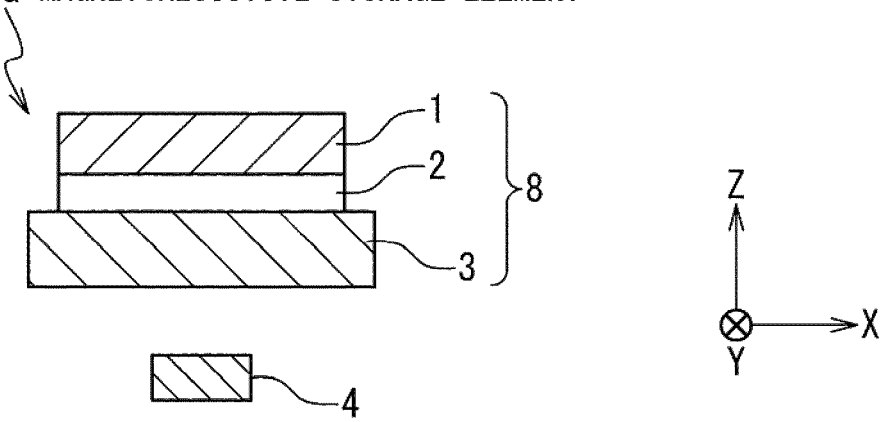
FIG. 5 is a sectional view showing a primary part of a magnetoresistive storage element of a magnetic storage device according to an application example of the exemplary embodiment of the present invention.
Figure 6:
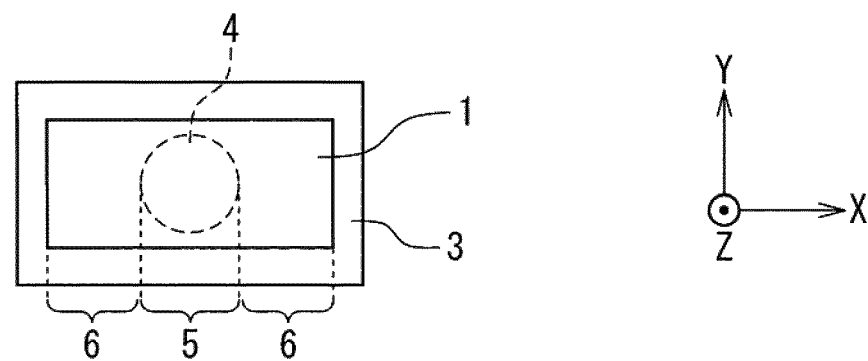
FIG. 6 is a plan view showing the primary part of the magnetoresistive storage element of the magnetic storage device according to the application example of the exemplary embodiment of the present invention.

In the exemplary embodiment of the present invention, the third magnetic body 4 is provided to the opposite side from the second magnetic body 3 with respect to the first magnetic body 1, as mentioned above. However, the third magnetic body 4 may be provided to the same side as the second magnetic body 3 with respect to the first magnetic body 1. This is shown in FIG. 5 and FIG. 6. FIG. 5 is a sectional view showing a primary part of a magnetoresistive storage element of a magnetic storage device according to an application example of the exemplary embodiment of the present invention. FIG. 6 is a plan view showing the primary part of the magnetoresistive storage element of a magnetic storage device according to the application example of the exemplary embodiment of the present invention. A magnetoresistive storage element 10a includes a laminated structure 8 in which a first magnetic body 1, a nonmagnetic body 2, and a second magnetic body 3 are laminated, and a third magnetic body 4 opposite to the second magnetic body 3. The first magnetic body 1 and the third magnetic body 4 are magnetically coupled. The magnetic coupling is exemplified by antiferromagnetic coupling, ferromagnetic coupling, and coupling through a fringing field of an end. Each configuration will not be described, because it is the same as the case of FIG. 3 and FIG. 4 excluding the difference in positional relationships between the laminated structure 8 and the third magnetic body 4. In this case too, the same effect as the case of FIG. 3 and FIG. 4 can be obtained.

In each above-mentioned exemplary embodiment, the third magnetic body 4 is shorter than the first magnetic body 1 in the long-side direction of the first magnetic body 1, and the aspect ratio of the third magnetic body 4 is smaller than the aspect ratio of the first magnetic body 1. However, the first magnetic body 1 may be shorter than the third magnetic body 4 in a long-side direction of the third magnetic body 4, and an aspect ratio of the first magnetic body 1 may be smaller than an aspect ratio of the third magnetic body 4. This is shown in FIG. 7 and FIG. 8, and FIG. 9 and FIG. 10.

Figure 7:
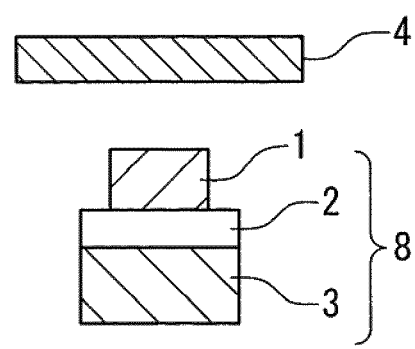
FIG. 7 is a sectional view showing a primary part of a magnetoresistive storage element of a magnetic storage device according to another application example of the exemplary embodiment of the present invention.
Figure 7:
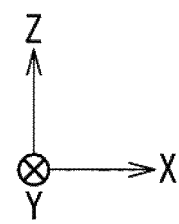
Figure 8:
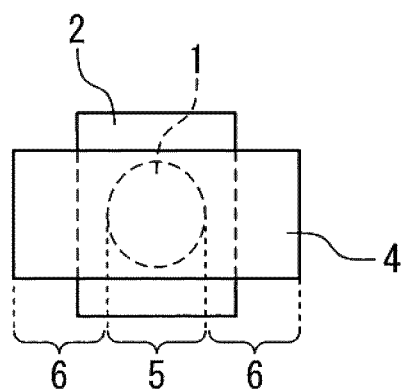
FIG. 8 is a plan view showing the primary part of the magnetoresistive storage element of the magnetic storage device according to the other application example of the exemplary embodiment of the present invention.
Figure 8:
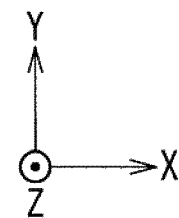

FIG. 7 is a sectional view showing a primary part of a magnetoresistive storage element of a magnetic storage device according to another application example of the exemplary embodiment of the present invention. FIG. 8 is a plan view showing the primary part of the magnetoresistive storage element of the magnetic storage device according to the application example of the exemplary embodiment of the present invention. A magnetoresistive storage element 10b includes a laminated structure 8 in which a first magnetic body 1, a nonmagnetic body 2, and a second magnetic body 3 are laminated, and a third magnetic body 4 opposite to the first magnetic body 1. The first magnetic body 1 and the third magnetic body 4 are magnetically coupled. The magnetic coupling is exemplified by antiferromagnetic coupling, ferromagnetic coupling, and coupling through a fringing field of an end. A planar shape (XY planar shape) of the first magnetic body 1 is shorter than that of the third magnetic body 4 in the long-side direction (X direction) of the third magnetic body 4. When the first magnetic body 1 is thrown (projected) onto the plane (XY plane) of the third magnetic body 4, the third magnetic body 4 has a region 5 which overlaps the first magnetic body 1 and a region 6 which does not overlap the first magnetic body 1 on the plane. Additionally, an aspect ratio of the length of a long axis in the planar shape (XY planar shape) of the first magnetic body 1 divided by the length of a short axis is smaller than an aspect ratio of the length of a long axis in the planar shape (XY planar shape) of the third magnetic body 4 divided by the length of a short axis.

Each configuration will not be described, because it is the same as the case of FIG. 3 and FIG. 4 excluding the opposite relationship between shapes of the first magnetic body 1 and the third magnetic body 4.

In this case too, the same effect as the case of FIG. 3 and FIG. 4 can be obtained for the relationship between the first magnetic body 1 and the third magnetic body 4.

Additionally, the first magnetic body 1, which has small shape anisotropy, is subject to the effect of thermal disturbance compared with magnetic bodies with relatively-large aspect ratios. However, the shape anisotropy of the third magnetic body 4 is maintained as mentioned above and the resistance to thermal disturbance thereof is high. Since the first magnetic body 1 and the third magnetic body 4 are magnetically coupled, high resistance to thermal disturbance of the third magnetic body 4 makes it possible for the first magnetic body 1 to have high resistance to thermal disturbance as well.

Figure 9:
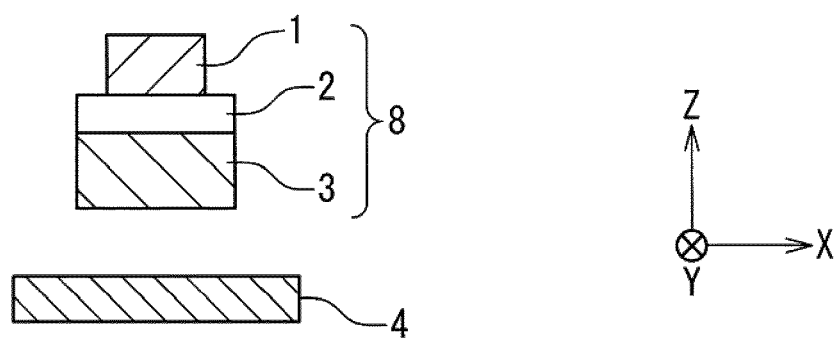
FIG. 9 is a sectional view showing a primary part of a magnetoresistive storage element of a magnetic storage device according to still another application example of the exemplary embodiment of the present invention.
Figure 10:
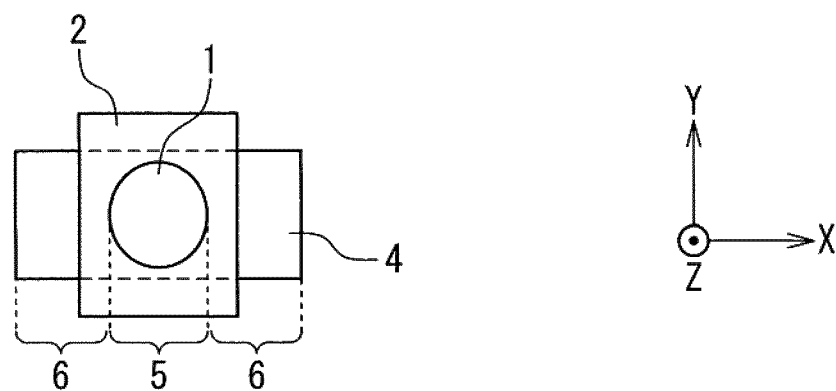
FIG. 10 is a plan view showing the primary part of the magnetoresistive storage element of the magnetic storage device according to still the other application example of the exemplary embodiment of the present invention.

FIG. 9 is a sectional view showing a primary part of a magnetoresistive storage element of a magnetic storage device according to still another application example of the exemplary embodiment of the present invention. FIG. 10 is a plan view showing a primary part of the magnetoresistive storage element of the magnetic storage device according to the application example of the exemplary embodiment of the present invention. A magnetoresistive element 10c has a laminated structure 8 in which a first magnetic body 1, a nonmagnetic body 2, and a second magnetic body 3 are laminated, and a third magnetic body 4 opposite to the second magnetic body 3. The first magnetic body 1 and the third magnetic body 4 are magnetically coupled. The magnetic coupling is exemplified by antiferromagnetic coupling, ferromagnetic coupling, and coupling through a fringing field of an end. Each configuration will not be described, because it is the same as the case of FIG. 7 and FIG. 8 excluding the difference in positional relationships between the laminated structure 8 and the third magnetic body 4. In this case too, the same effect as the case of FIG. 7 and FIG. 8 can be obtained.

Next, a magnetic storage device according to an exemplary embodiment of the present invention will be described in detail.

Figure 11:
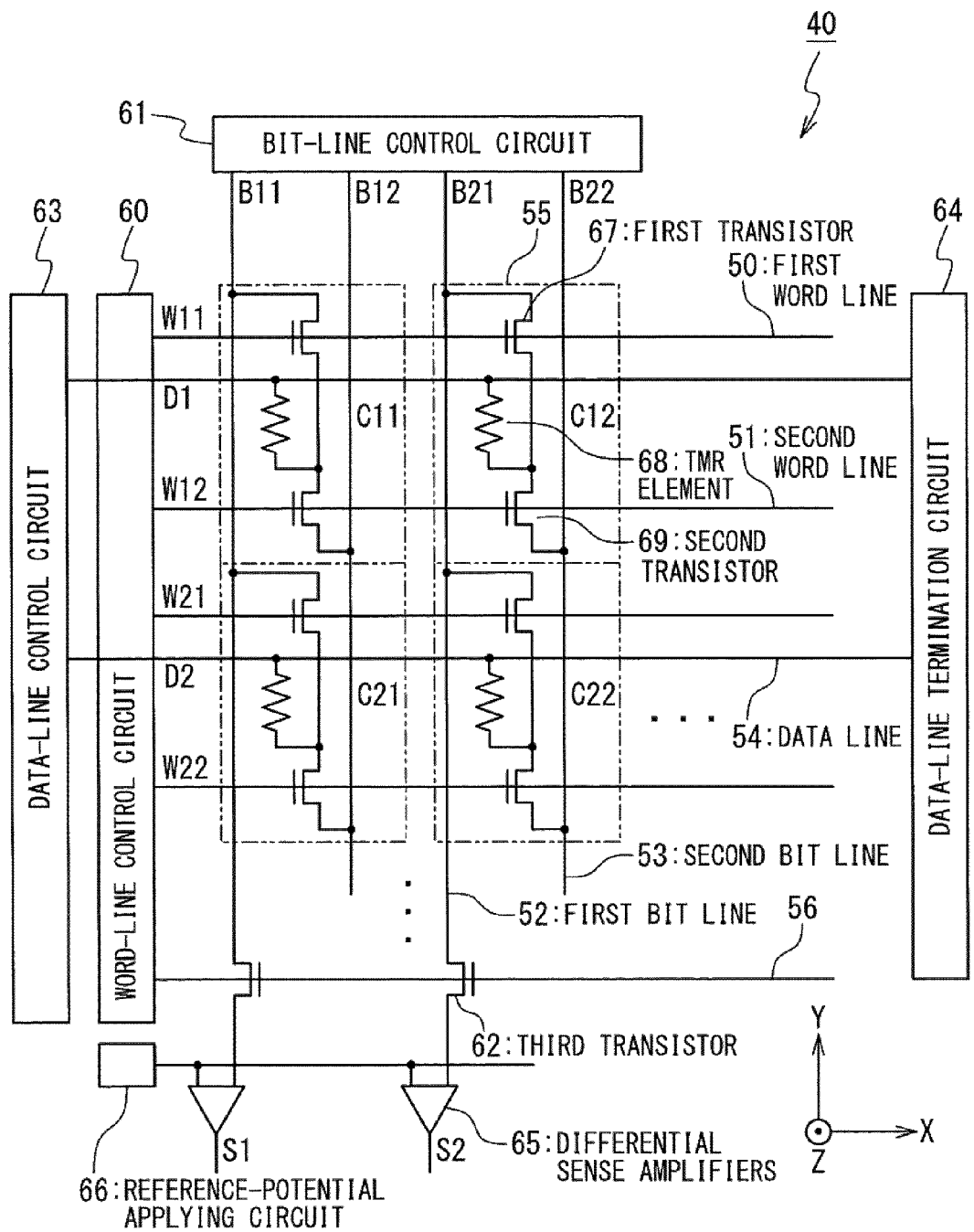
FIG. 11 is a schematic circuit block diagram showing a configuration of a magnetic storage device according to an exemplary embodiment of the present invention.
Figure 12:
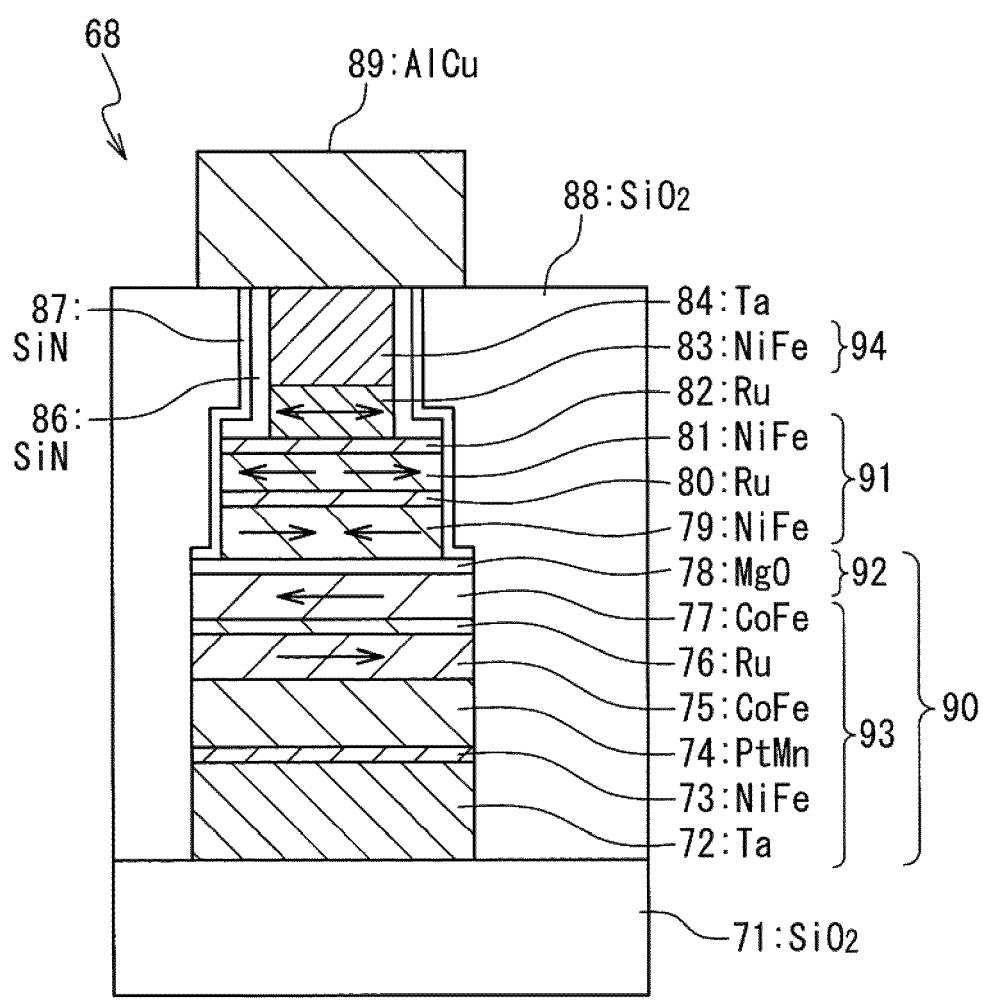
FIG. 12 is a sectional view showing a primary part of a configuration of a magnetoresistive storage element applied to the magnetic storage device according to the exemplary embodiment of the present invention.
Figure 13:
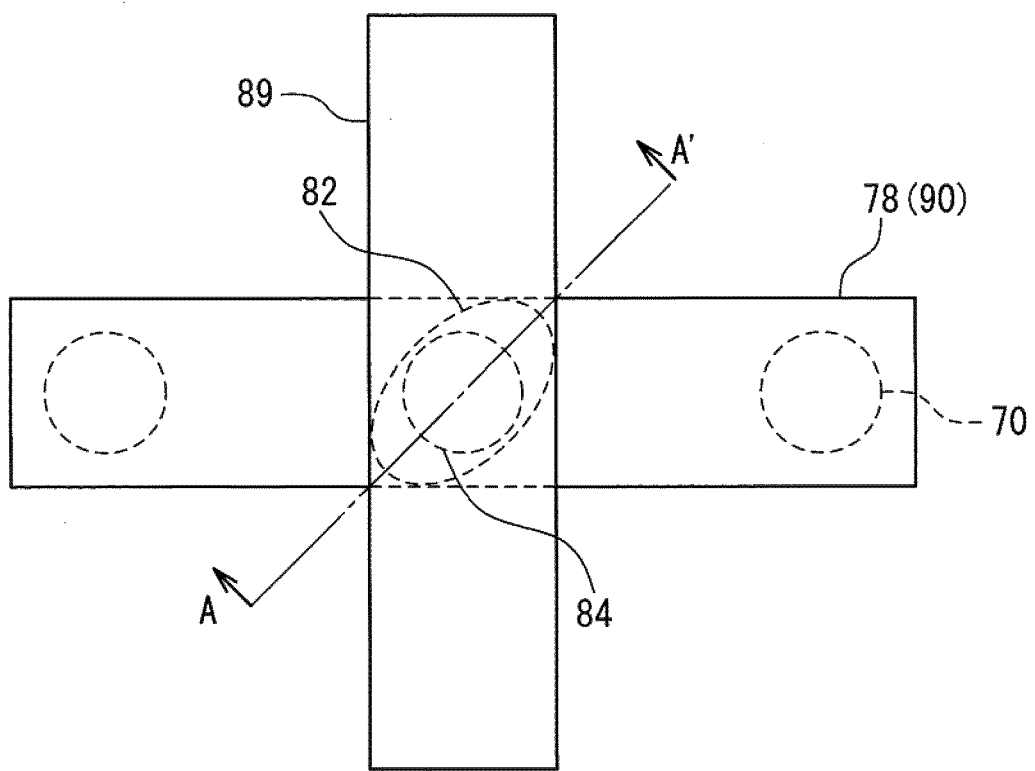
FIG. 13 is a plan view of a primary part of a memory array showing a configuration of the magnetoresistive storage element applied to the magnetic storage device according to the exemplary embodiment of the present invention.

FIG. 11 is a schematic circuit block diagram showing a configuration of a magnetic storage device according to an exemplary embodiment of the present invention. FIG. 12 is a sectional view showing a primary part of a configuration of a magnetoresistive storage element applied to the magnetic storage device according to the exemplary embodiment of the present invention. FIG. 13 is a plan view of a main part of a memory array showing a configuration of the magnetoresistive storage element applied to the magnetic storage device according to the exemplary embodiment of the present invention. FIG. 12 is an AA' sectional view of FIG. 13.

First, a circuit configuration will be described with reference to FIG. 11. A magnetic storage device 40 is a magnetic random-access memory. The magnetic storage device 40 includes a plurality of first word lines 50, a plurality of second word lines 51, a plurality of first bit lines 52, a plurality of second bit lines 53, a plurality of data lines 54, a plurality of memory cells 55, a read word line 56, a word-line control circuit 60, a bit-line control circuit 61, a plurality of third transistors 62, a data-line control circuit 63, a data-line termination circuit 64, differential sense amplifiers 65, and a reference-potential applying circuit 66.

The plurality of first word lines 50 extends in the X direction. The respective one ends of the first word lines 50 are connected to the word-line control circuit 60 and the other ends are open. The plurality of second word lines 51 extends in the X direction. The respective one ends of the second word lines 51 are connected to the word-line control circuit 60 and the other ends are open. The plurality of first bit lines 52 extends in the Y direction, which is different from the X direction. The respective one ends of the first bit lines 52 are connected to the bit-line control circuit 61 and the other ends are connected to the differential sense amplifiers 65 through the third transistors 62. The plurality of second bit lines 53 extends in the Y direction. The respective one ends of the second bit lines 53 are connected to the bit-line control circuit 61 and the other ends are open. The plurality of data lines 54 extends in the X direction. One ends of the data lines 54 are connected to the data-line control circuit 63 and the other ends are connected to the data-line termination circuit 64. One end of the read word line 56, which extends in the X direction, is connected to the word-line control circuit 60 and the other end is open.

The plurality of memory cells 55 are arranged in the form of an array in the vicinities of intersections of the plurality of data lines 54 and the plurality of first bit lines 52 (or the plurality of second bit lines 53). Each of the memory cells 55 includes a first transistor 67, a TMR element 68 as a magnetoresistive storage element, and a second transistor 69. The TMR element 68 includes a BASE layer (including a pinned layer) having two terminals. One terminal of the BASE layer is connected to the first bit line 52 through the first transistor 67 and the other terminal is connected to the second bit line 53 through the second transistor 69. A free layer (mentioned later) of the TMR element 55 is connected to the data line 54. A gate of the first transistor 67 and a gate of the second transistor 69 are connected to the first word line 50 and the second word line 51, respectively.

The word-line control circuit 60, at the time of a read operation, selects a selected first word line 50 from the plurality of first word lines 50 and also selects the read word line to turn on the first transistor 67 and the third transistor 62. At the time of a write operation, a selected first word line 50 is selected from the plurality of first word lines 50 and a selected second word line 51 is also selected from the plurality of second word lines 51 to turn on the first transistor 67 and the second transistor 69.

The bit-line control circuit 61, at the time of the read operation, selects a selected first bit line 52 from the plurality of first bit lines 52. At the time of the write operation, a selected first bit line 52 is selected from the plurality of first bit lines 52 and a selected second bit line 53 is selected from the plurality of second bit lines 53. A gate, one terminal, and the other terminal of the third transistor 62 are connected to the read word line 56, the first bit line 52, and the differential sense amplifier 65, respectively. The data-line control circuit 63, at the time of the read operation, selects a selected data line 54 from the plurality of data lines 54. The data-line termination circuit 64, at the time of the read operation, opens the plurality of data lines 54. The differential sense amplifier 65, at the time of the read operation, reads data by comparing voltage of the first bit line 52 supplied through the third transistor 62 and reference voltage supplied through the reference-potential applying circuit 66. The reference-potential applying circuit 66 supplies the reference voltage to the differential sense amplifier 65.

Next, a configuration of a magnetoresistive storage element will be described with reference to FIG. 12 and FIG. 13. The TMR element 68 as a magnetoresistive storage element includes: a Ta film 72 as a lower electrode; a NiFe film 73, a PtMn film 74, a CoFe film 75, a Ru film 76, and a CoFe film 77 as a second magnetic body 93; a MgO film 78 as a nonmagnetic body 92; a NiFe film 79, a Ru film 80, and a NiFe film 31 as a first magnetic body 91; a Ru film 82 which magnetically couples the first magnetic body 91 and a third magnetic body 94 (also referred to as auxiliary magnetic layer); a NiFe film 83 as the third magnetic body 94; and a Ta film 84 as an upper electrode. Here, the second magnetic body 93 (the NiFe film 73, the PtMn film 74, the CoFe film 75, the Ru film 76, and the CoFe film 77) corresponds to a pinned layer. The nonmagnetic body 92 (the MgO film 78) corresponds to a barrier layer. The first magnetic body 91 (the NiFe film 79, the Ru film 80, and the NiFe film 81) corresponds to a free layer.

The Ta film 72 as a lower electrode, is connected to a semiconductor substrate (not shown) provided with elements including the first transistor 67 and the second transistor 69, through a W via 70. The Ta film 84 as an upper electrode, is connected to an AlCu wiring line 89 as the data line 54. The lower structure of the TMR element 68 (the NiFe film 73, the PtMn film 74, the CoFe film 75, the Ru film 76, the CoFe film 77, and the MgO film 78) is also referred to as a BASE layer 90.

Next, a manufacturing method of the magnetoresistive storage element will be described with reference to FIG. 12. A $SiO_2$ film 71 with the film thickness of 300 nm as an interlayer insulating film is formed on a semiconductor substrate (not shown) provided with such elements as the first transistor 67 and the second transistor 69 and wiring lines including the first bit line 52 and the second bit line 53. The W via 70 is formed in a predetermined position of the $SiO_2$ film 71. After that, the Ta film 72 with the film thickness of 20 nm, a Ta film with the film thickness of 8 nm (not shown), the NiFe film 73 with the film thickness of 1 nm, the PtMn film 74 with the film thickness of 10 nm, the CoFe film 75 with the film thickness of 2 nm, the Ru film 76 with the film thickness of 0.8 nm, the CoFe film 77 with the film thickness of 2 nm, the MgO film 78 with the film thickness of 1.0 nm, the NiFe film 79 with the film thickness of 2.5 nm, the Ru film 80 with the film thickness of 0.8 nm, the NiFe film 81 with the film thickness of 2.0 nm, the Ru film 82 with the film thickness of 0.9 nm, the NiFe film 83 with the film thickness of 2.0 nm, and the Ta film 84 with the film thickness of 50 nm are each formed with the sputtering method. Furthermore, a $SiO_2$ film 85 with the film thickness of 70 nm is formed with the plasma CVD method. The Ru film 76 has a thickness with which the CoFe film 75 and the CoFe film 77 are antiferromagnetically coupled. The Ru film 80 has a thickness with which the NiFe film 79 and the NiFe film 81 are antiferromagnetically coupled. The Ru film 82 has a thickness with which the NiFe film 81 and the NiFe film 83 are antiferromagnetically coupled.

Next, resist is formed to the shape of the third magnetic body 94 with the photolithographic technique. The $SiO_2$ film 85 excluding the resist is processed with the Reactive Ion Etching (RIE) technique. Then, the resist is removed by asking. Next, the Ta film 84 and the NiFe film 83 are removed by milling with the pattern of the $SiO_2$ film 85 as a mask. After that, the SiN film 86 as a protective film is formed on the whole surface. Resist is formed to the shape of the TMR pattern thereafter, and the SiN film 86, the Ru film 82, the NiFe film 81, the Ru film 80, and the NiFe film 79 are processed. Furthermore, a SiN film 87 as a protective film is formed on the whole surface. Resist is formed to the shape of the BASE layer 90 thereafter, and the SiN film 87, the MgO film 78, the CoFe film 77, the Ru film 76, the CoFe film 75, the PtMn film 74, the NiFe film 73, and the Ta film 72 are processed.

With the above manufacturing processes, the TMR element 68 can be formed.

The BASE layer 90 is a shape that is long in one direction. The first magnetic body 91 (free layer), which includes the NiFe film 79, the Ru film 80, and the NiFe film 81, is inclined at approximately 45 degrees with respect to a long-axis direction of the BASE layer 90. The first magnetic body 91 is an elliptic shape with a short side (short axis) of the planar shape being 0.32 μm and a long side (long axis) being 0.64 μm. The NiFe film 83, which is the third magnetic body 94, is a circular shape with a radius of 0.14 μm.

After that, a $SiO_2$ film 88 as an interlayer insulating film is formed on the whole surface with the plasma CVD method. After that, the whole surface is planarized with the CMP (Chemical Mechanical Polishing) technique, to expose the Ta film 84 to the surface. Next, a Ti film with the film thickness of 30 nm, an AlCu film with the film thickness of 500 nm, and a TiN film with the film thickness of 30 nm are laminated, which are processed with the photolithographic technique and the dry etching technique to form an AlCu wiring line 89 as the data line 54.

Next, the temperature of a semiconductor substrate is increased to approximately 275 degrees Celsius and a magnetic field of approximately 1000 to 10000 Oe is applied to a long side (long axis) direction of the TMR pattern. Consequently, the CoFe film 75 and the CoFe film 77 of the pinned layer are directed toward a direction along the magnetic field. When the temperature is lowered, the PtMn film 74, which is an antiferromagnetic body, performs antiferromagnetic coupling such that a magnetization direction of the CoFe film 75 is along the direction of the applied magnetic field. When the applied magnetic field is turned back to zero, since the CoFe film 77 and the CoFe film 75 are antiferromagnetically coupled, the magnetization directions thereof become the opposite directions. Consequently, a magnetization direction of the pinned layer can be set to a desired direction.

FIG. 14A to FIG. 14D are plan views showing examples of planar shapes of the TMR element 68. In these drawings, the NiFe film 81 is shown as the first magnetic body 91 (free layer) of the TMR element 68, and the NiFe film 33 is shown as the third magnetic body (auxiliary magnetic layer) of the TMR element 68. A planar shape of the first magnetic body 91 (including the NiFe film 81) is a shape that is long in one direction and has shape anisotropy. An elliptic shape (FIG. 14A to FIG. 14D), a rectangular shape, a diamond shape, a parallelogram, a hexagonal shape, and a shape of a track of a stadium are exemplified. A planar shape of the third magnetic body (NiFe film 83) is a shape with an aspect ratio, which is a ratio of a long-side direction to a short-side direction, smaller than an aspect ratio of the first magnetic body 91. A circular shape (FIG. 14C and FIG. 14D), an elliptic shape (FIG. 14A and FIG. 14B), a rectangular shape, a square shape, a diamond shape, a parallelogram, a hexagonal shape, and a shape of a track of a stadium are exemplified. As for a short-side direction, the third magnetic body may be larger than the first magnetic body 91.

Figure 14A:
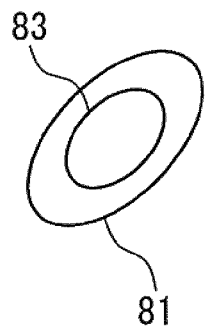
FIG. 14A is a plan view showing an example of a planar shape of a TMR element.
Figure 14B:
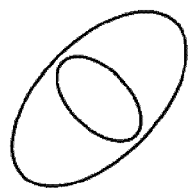
FIG. 14B is a plan view showing an example of the planar shape of the TMR element.
Figure 14C:
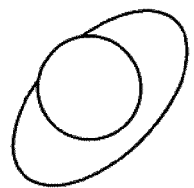
FIG. 14C is a plan view showing an example of the planar shape of the TMR element.
Figure 14D:
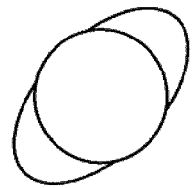
FIG. 14D is a plan view showing an example of the planar shape of the TMR element.

When the processes according to the present exemplary embodiment are used, since the first magnetic body 91 is processed with the third magnetic body as a mask, a shape is formed in which a portion of the third magnetic body that sticks out is added to the shape of the first magnetic body 91 as shown in FIG. 14C and FIG. 14D. As for the long-side direction of the first magnetic body 91, the third magnetic body is designed to be smaller than the first magnetic body 91. Consequently, a region that does not face the third magnetic body is formed in the first magnetic body 91.

Next, an operation method of the magnetic storage device will be described with reference to FIG. 11. First, a write method will be described.

The word-line control circuit 60 selects a selected first word line 50 and a selected second word line 51 which correspond to a word address to which data is written, from the plurality of first word lines 50 and the plurality of second word lines 51. Consequently, the first transistor 56 and the second transistor 57 which correspond to the word address for write are turned to the ON state. On the other hand, the other first transistors 56 and second transistors 57 remain the OFF state. The bit-line control circuit 61 selects a selected first bit line 52 and a selected second bit line 53 which correspond to a bit address to which data is written, from the plurality of first bit lines 52 and the plurality of second bit lines 53. Then a potential difference is given between the selected first bit line 52 and the selected second bit line 53, and a write current, e.g. 3 mA, flows through the BASE layer 90 of the TMR element 68 of a memory cell for write. With polarity of the potential difference between the first bit line 52 and the second bit line 53, a current with a desired direction can be flowed through the BASE layer 90. A write magnetic field is caused around the BASE layer 90 due to the current flowing through the BASE layer 90. Since the NiFe film 79 of the first magnetic body 91 is thicker than the antiferromagnetically-coupled NiFe film 81, a magnetization direction of the NiFe film 79 will turn to a direction of the magnetic field. The NiFe film 83 of the third magnetic body 94 (auxiliary magnetic layer) will also turn to the direction of the magnetic field. By generating a sufficiently-strong current magnetic field, a magnetization direction of the first magnetic body 91 can be directed to a desired direction. Consequently, data write can be performed.

Next, a read method will be described.

The word-line control circuit 60 selects a selected first word line 50 that corresponds to a word address from which data is read, from the plurality of first word lines 50. Consequently, the first transistor 56 that corresponds to the word address for read is turned to the ON state. At the same time, a read word line 56 is selected and the third transistor 62 is also turned to the ON state. Next, the data-line control circuit 61 selects a selected data line 54 from the plurality of data lines 54. Then the selected data line 54 is set to 0 V. The bit-line control circuit 60 selects a selected first bit line 52 that corresponds to a bit address from which data is read, from the plurality of first bit lines 52. Then a read current of 20 μA is applied to the selected first bit line 52. The TMR element 68 has a resistance value of either 10 kΩ or 20 kΩ depending on data. When on-resistance of each transistor is 1 kΩ, the potential of the selected first bit line 52 shows either 0.21 V or 0.41 V. The reference-potential generating circuit 64 provides a reference potential of 0.3 V to the differential sense amplifier 65. The differential sense amplifier 63 distinguishes data based on the potential of the selected first bit line 52 and the reference potential of 0.3 V.

According to the present exemplary embodiment, the aspect ratio of the planar shape of the third magnetic body is smaller than the aspect ratio of the planar shape of the first magnetic body 91. For this reason, the magnetization direction of the third magnetic body will change in a smaller magnetic field compared with the first magnetic body 91. Since the NiFe film 83 of the third magnetic body and the NiFe film 81 of the first magnetic body 91 are antiferromagnetically coupled, force to help magnetization switching of the first magnetic body 91 is finally transmitted from the third magnetic body. This force works to the whole region of the NiFe film 81 of the first magnetic body 91 facing the NiFe film 83 of the third magnetic body. As for the magnetization switching of the first magnetic body 91 with the pattern that is long in one direction used in the present invention, the slowest switching occurs at a portion along a long side. In the present exemplary embodiment, magnetization switching in a region in the vicinity of a long side can be assisted by the combination with the third magnetic body. For this reason, a write current can be small.

According to a simulation, switching current is 2.8 mA in the case of the TMR element with no third magnetic body, while switching current is 3 mA or above, 2.5 mA, 2.3 mA, 2.3 mA, and 2.5 mA in the case where the NiFe films 83 as the third magnetic body with the thicknesses of 0.5 nm, 1.0 nm, 1.5 nm, 2.0 nm, and 2.5 nm are provided, respectively. That is, there is conditions to be able to reduce the switching current. Additionally, there is an optimum value for the thickness of the auxiliary magnetic film due to the configuration of the first magnetic body 91. A write current is the smallest with the thicknesses of 1.5 nm and 2.0 nm in this simulation.

The first magnetic body 91 has a region that does not face the third magnetic body, and this region is less affected because of no presence of the third magnetic body and more dominated by the shape anisotropy of the first magnetic body 91 itself. For this reason, there is effect to prevent the occurrence of magnetization switching, which is caused by thermal disturbance in the third magnetic body with a small aspect ratio, excluding the write operation.

Next, a magnetic storage device according to another exemplary embodiment of the present invention will be described in detail.

Figure 15:
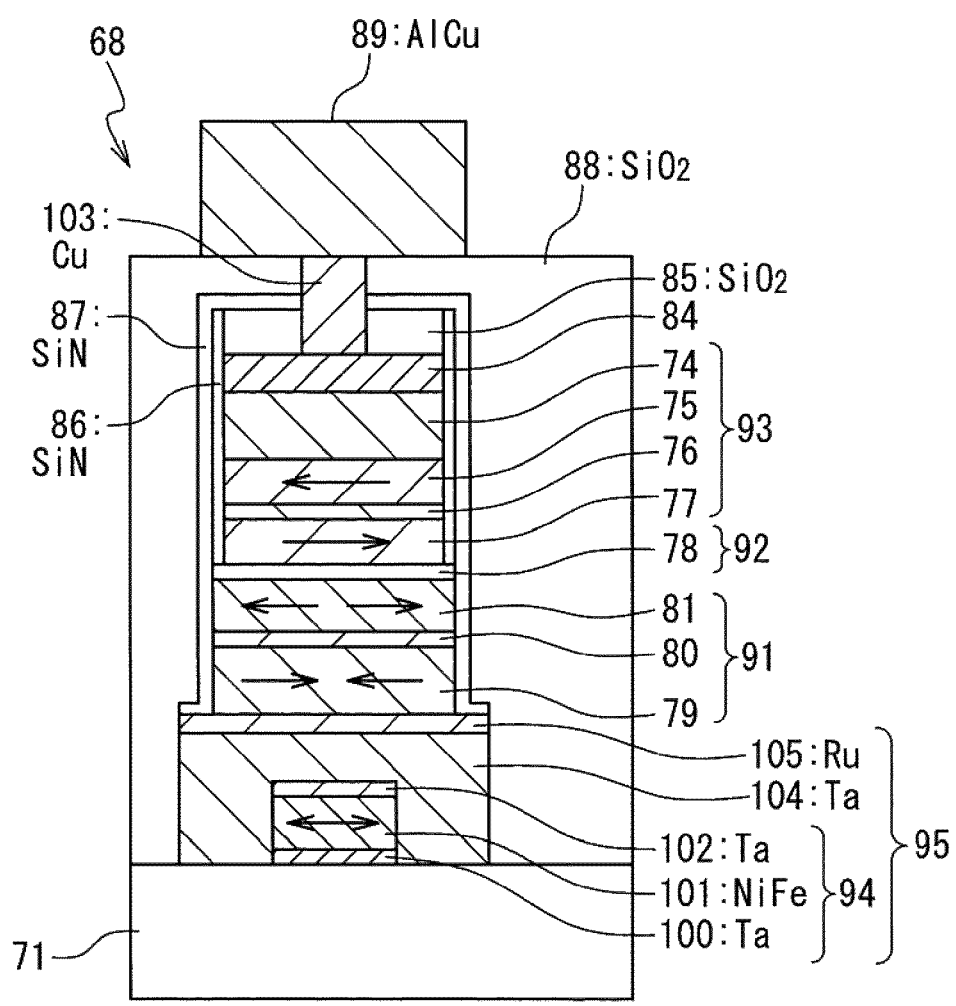
FIG. 15 is a sectional view showing a primary part of a configuration of a magnetoresistive storage element applied to a magnetic storage device according to another exemplary embodiment of the present invention.
Figure 16:
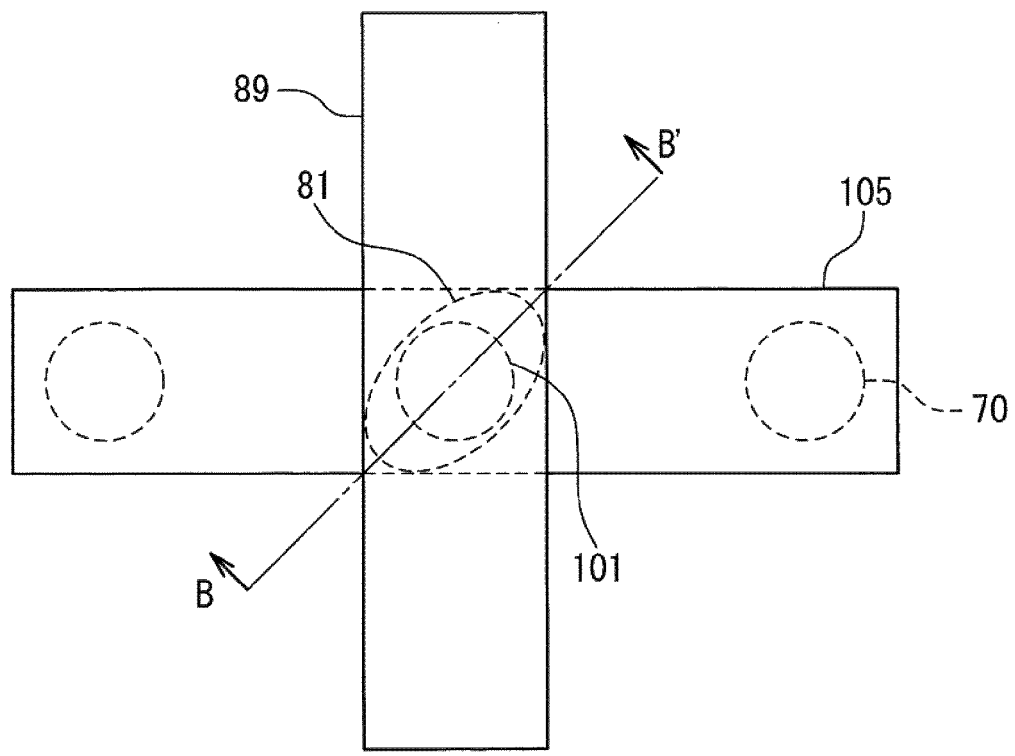
FIG. 16 is a plan view of a primary part of a memory array showing a configuration of the magnetoresistive storage element applied to the magnetic storage device according to the exemplary embodiment of the present invention.

FIG. 11 is a schematic circuit block diagram showing a configuration of a magnetic storage device according to another exemplary embodiment of the present invention. FIG. 15 is a sectional view showing a configuration of a primary part of a magnetoresistive storage element applied to the magnetic storage device according to the exemplary embodiment of the present invention. FIG. 16 is a plan view of a configuration of a primary part of a memory array showing the magnetoresistive storage element applied to the magnetic storage device according to the exemplary embodiment of the present invention. FIG. 15 is a BB' sectional view of FIG. 16. FIG. 11, which is mentioned above, will not be described.

Next, the configuration of the magnetoresistive storage element will be described with reference to FIG. 15 and FIG. 16. The TMR element 68 as a magnetoresistive storage element includes: a Ta film 104 as a lower electrode; a Ta film 100, a NiFe film 101, and a Ta film 102 as the third magnetic body. (auxiliary magnetic layer) 94; a Ru film 105 for magnetically connecting the first magnetic body 91 and the third magnetic body 94; a NiFe film 79, a Ru film 80, and a NiFe film 31 as the first magnetic body 91; a MgO film 78 as the nonmagnetic body 92; a CoFe film 77, a Ru film 76, a CoFe film 75, a PtMn film 74 as the second magnetic body 93; and a Ta film 84 as an upper electrode. Here, the second magnetic body 93 (the CoFe film 77, the Ru film 76, the CoFe film 75, and the PtMn film 74) corresponds to a pinned layer. The nonmagnetic body 92 (MgO film 78) corresponds to a barrier layer. The first magnetic body 91 (the NiFe film 79, the Ru film 80, and the NiFe film 81) corresponds to a free layer.

The Ta film 104, which is the lower electrode, is connected to a semiconductor substance (not shown) provided with elements including the first transistor 67 and the second transistor 69 with the Ta film 100 through a W via 70. The Ta film 84, which is the upper electrode, is connected to an AlCu wiring line 89 as the data line 54. The Ta film 100, the NiFe film 101, the Ta film 102, and the Ta film 104 are also referred to as a write wiring line 95.

A manufacturing method of the magnetoresistive storage element will be described with reference to FIG. 15. A SiO$_2$ film 71 as an interlayer insulating film is formed with the film thickness of 300 nm on a semiconductor substrate (not shown) provided with such elements as the first transistor 67 and the second transistor 69, and wiring lines including the first bit line 52 and the second bit line 53. The W via 70 is formed in a predetermined position of the SiO₂ film 71. After that, the Ta film 100 with the film thickness of 5 nm, the NiFe film 101 with the film thickness of 1 nm to 30 nm, and the Ta film 102 with the film thickness of 5 nm are formed with the sputtering method, and the SiO₂ film 103 with the film thickness of 20 nm is formed with the CVD method. Next, a resist pattern is formed to the shape of the third magnetic body 93 (auxiliary magnetic layer) and the SiO₂ film 103 is processed by the RIE. After the resist is removed with ashing processing, the Ta film 102, the NiFe film 101, and the Ta film 102 are processed with the ion milling method with the SiO₂ film 103 as a mask. The mask of the SiO₂ film 103 is adjusted such that the SiO₂ film 103 is removed during processing and the Ta film 102 is exposed, but the SiO₂ film 103 may also be left. Next, the Ta film 104 with the film thickness of 50 nm is formed on the whole surface as a lower electrode, which is planarized with the CMP. Furthermore, the Ru film 105 with the film thickness of 5 nm, the NiFe film 79 with the film thickness of 2.5 nm, the Ru film 80 with the film thickness of 0.8 nm, the NiFe film 81 with the film thickness of 2.0 nm, the MgO film 78 with the film thickness of 1.0 nm, the CoFe film 77 with the film thickness of 2 nm, the Ru film 76 with the film thickness of 0.8 nm, the CoFe film 75 with the film thickness of 2 nm, the PtMn film 74 with the film thickness of 10 nm, and the Ta film 84 with the film thickness of 50 nm, are formed with the sputtering method, and the SiO₂ film 85 with the film thickness of 70 nm is formed with the plasma CVD method. The Ru film 76 has a thickness with which the CoFe film 75 and the CoFe film 77 are antiferromagnetically coupled, and the Ru film 80 has a thickness with which the NiFe film 79 and the NiFe 81 film are antiferromagnetically coupled.

Next, resist is formed to the shape of the TMR element 68 with the photolithographic technique. The SiO₂ film 85 excluding the resist is processed by the RIE. Then, the resist is removed by ashing. Next, the Ta film 84, the PtMn film 74, the CoFe film 75, the Ru film 76, and the CoFe film 77 are removed by milling with the pattern of the SiO₂ film 85 as a mask. After that, the SiN protective film 86 is formed on the whole surface, and the SiN film 86, the MgO film 78, the NiFe film 81, the Ru film 80, and the NiFe film 79 by ion milling thereafter. Next, a resist pattern is formed to an wiring line shape after the SiN film 87 as a protective film is formed on the whole surface, and the SiN film 87, the Ru film 105, and the Ta film 104 are processed, in order to form the write wiring line 95.

With the above manufacturing processes, the TMR element 68 can be formed.

The first magnetic body 91 (free layer), which includes the NiFe film 81, the Ru film 80, and the NiFe film 79, is inclined at 45 degrees with respect to an extension direction of the write wiring line 95 and is an elliptic shape with a short side (short axis) of a planar shape being 0.32 μm and a long side (long axis) being 0.64 μm. The third magnetic body 94 (auxiliary magnetic layer) is a circular shape with a radius of 0.16 μm.

After that, the SiO₂ film 88 is formed as an interlayer insulating film on the whole surface with the plasma CVD method, and the whole surface is planarized with the CMP technique thereafter. Next, a via is formed on the TMR element 68 and a Ta-film seed layer with the film thickness of 1 nm is formed on the whole surface, to be plated with Cu thereafter. After the planarization by the CMP, a Ti film with the film thickness of 30 nm, an AlCu film with the film thickness of 500 nm, and a TiN film with the film thickness of 30 nm are laminated, and then, processed with the photolithographic technique and the dry etching technique to form an AlCu wiring line 89 as the data line 54.

Next, the temperature of the semiconductor substrate is increased to approximately 275 degrees Celsius and a magnetic field of approximately 1000 to 10000 Oe is applied to a long-side (long-axis) direction of the TMR pattern. Consequently, the CoFe film 75 and the CoFe film 77 of the pinned layer are directed toward a direction along the magnetic field. When the temperature is lowered, the PtMn film 74, which is the antiferromagnetic body, performs antiferromagnetic coupling such that a magnetization direction of the CoFe film 75 is along the direction of the applied magnetic field. Since the CoFe film 77 and the CoFe film 75 are antiferromagnetically coupled, the magnetization directions become opposite directions when the applied magnetic field is turned back to zero. Consequently, a magnetization direction of the pinned layer can be set to a desired direction.

Figure 17A:
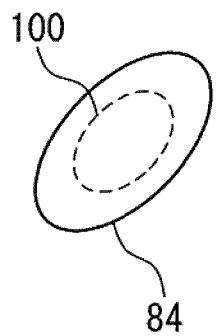
FIG. 17A is a plan view showing another example of a planar shape of a TMR element.
Figure 17B:
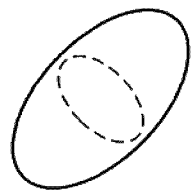
FIG. 17B is a plan view showing another example of the planar shape of the TMR element.
Figure 17C:
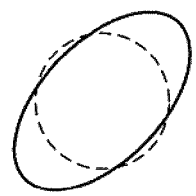
FIG. 17C is a plan view showing another example of the planar shape of the TMR element.

FIG. 17A to FIG. 17C are plan views showing other examples of planar shapes of the TMR element 68. In the drawings, the NiFe film 81 is shown as the first magnetic body 91 (free layer) of the TMR element 68 and the NiFe film 101 is shown as the third magnetic body (auxiliary magnetic layer) of the TMR element 68. A planar shape of the first magnetic body 91 (including the NiFe film 81) is a shape that is long in one direction, having shape anisotropy. An elliptic shape (FIG. 17A to FIG. 17C), a rectangular shape, a diamond shape, a parallelogram, a hexagonal shape, and a shape of a track of a stadium are exemplified. A planar shape of the third magnetic body (NiFe film 101) is a shape with an aspect ratio, which is a ratio of a long-side direction to a short-side direction, set smaller than an aspect ratio of the first magnetic body 91. A circular shape (FIG. 17C), an elliptic shape (FIG. 17A and FIG. 17B), a rectangular shape, a square shape, a diamond shape, a parallelogram, a hexagonal shape, and a shape of a track of a stadium are exemplified. As for a short-side direction of the first magnetic body 91, the third magnetic body may be larger than the first magnetic body 91. As for a long-side direction of the first magnetic body 91, the third magnetic body is set to be smaller than the first magnetic body 91. Consequently, a region that does not face the third magnetic body is formed to the first magnetic body 91.

Next, an operation method of the magnetic storage device will be described with reference to FIG. 11. First, a write method will be described.

The word-line control circuit 60 selects a selected first word line 50 and a selected second word line 51 which correspond to a word address to which data is written, from the plurality of first word lines 50 and the plurality of second word lines 51, respectively. As a result, the first transistor 56 and the second transistor 57 which correspond to the word address for write are turned to the ON state. On the other hand, the other first transistors 56 and second transistors 57 remain the OFF state. The bit-line control circuit 61 selects a selected first bit line 52 and a selected second bit line 53 which correspond to a bit address to which data is written, from the plurality of first bit lines 52 and the plurality of second bit lines 53, respectively. Then a potential difference is given between the selected first bit line 52 and the selected second bit line 53. Thus, a write current, e.g. 2 mA, flows through the write wiring line 95 of the TMR element 68 of a memory cell for write. With polarity of the potential difference between the first bit line 52 and the second bit line 53, a current with a desired direction can be made to flow through the write wiring line 95. Due to the current flowing through the write wiring line 95, a write magnetic field is generated around the write wiring line 95. Since the NiFe film 79 of the first magnetic body 91 is thicker than the antiferromagnetically-coupled NiFe film 81, a magnetization direction of the NiFe film 79 will be directed to the direction of the magnetic field. Additionally, the NiFe film 101 of the third magnetic body 94 (auxiliary magnetic layer), which is provided to the opposite side from the TMR element 68 on the write wiring line 95, will be directed to the opposite direction from the NiFe film 79. By generating a sufficiently-strong current magnetic field, a magnetization direction of the first magnetic body 91 can be directed to a desired direction. Consequently, data write can be performed.

Data read is the same as the case of the first exemplary embodiment.

According to the present exemplary embodiment, an aspect ratio of the planar shape of the third magnetic body 94 (auxiliary magnetic layer) is smaller than that of the first magnetic body 91 (including the NiFe film 79). For this reason, the magnetization direction changes in a smaller magnetic field compared with the first magnetic body 91. At this time, a fringing field from an end of the NiFe film 101 works toward a direction that helps magnetization switching of the NiFe film 79 since the NiFe film 101 of the third magnetic body 94 and the NiFe film 79 of the first magnetic body 91 are magnetized in near directions. This force works to the whole region of the NiFe 79 that faces the NiFe film 101, and in particular, works to a portion close to an end of the NiFe film 101, i.e., to the vicinity of the long side of the first magnetic body 91. In the magnetization switching of the first magnetic body 91 with the pattern that is long in one direction used in the present invention, switching is the slowest at a portion along a long side. In the present exemplary embodiment, magnetization switching in a region in the vicinity of the long side can be assisted by a fringing field from an end of the third magnetic body 94. For this reason, the write current can be smaller.

According to a simulation, switching current is 2.4 mA in the case of a TMR element with no third magnetic body 94 while switching current is reduced to 1.8 mA when providing 2.5 nm of the third magnetic body 94 (NiFe film 101). The first magnetic body 91 includes a region that does not face the third magnetic body 94, and this region is less affected because of no presence of the third magnetic body 94 and more dominated by shape anisotropy of the first magnetic body 91 itself. Therefore, there is effect to prevent the occurrence of magnetization stitching, which is caused by thermal disturbance in the third magnetic body 94 with a small aspect ratio, excluding the write operation.

When changing the radius of the third magnetic body 94 from 0.22 μm to 0.33 μm, switching current is constantly 1.8 mA when the radius is 0.22 μm to 0.31 μm but is increased to 1.9 mA when the radius is 0.33 μm. Therefore, variation in sizes affects variation in switching fields when making the third magnetic body with 0.32 μm and above, which is a half of the long side of the first magnetic body 91. For this reason too, it is necessary to shorten the length of the long-side direction of the third magnetic body 94 compared with the length of the long-side direction of the first magnetic body 91, as performed in the present invention.

Although a single-layer magnetic body is used as the third magnetic body in the above exemplary embodiment, a multilayer structure and a structure in which magnetic bodies are laminated by sandwiching a conductive film may also be used. When a film configuration is used in which a plurality of magnetic bodies are antiferromagnetically coupled through a conductive film and the entire magnetic amount is approximately zero, the strength of antiferromagnetic coupling is adjusted with the thickness of a conductive film for example, such that magnetization directions of both magnetic bodies which are antiferromagnetically coupled in a magnetic field smaller than a magnetic field in which magnetization of the first magnetic body 91 is switching, come off the opposite directions. Although a pair of magnetic bodies which are antiferromagnetically coupled by sandwiching a conductive film is used as the first magnetic body, more layers may further be laminated or a single-layer magnetic film and a film in which a plurality of magnetic bodies are laminated may also be used. Though a structure in which a pair of magnetic bodies antiferromagnetically coupled by sandwiching a conductive film and an antiferromagnetic layer are magnetically coupled, is used as the pinned layer, more layers may be laminated for the magnetic bodies and a single-layer magnetic film and a film in which a plurality of magnetic bodies are laminated may also be used. Alternatively, a structure with no antiferromagnetic body, provided with a means to direct a magnetization direction of a magnetic body to a desired direction at the time of read, is also possible. The first magnetic body, which is positioned by being shifted by 45 degrees from an extension direction of a wiring line for flowing of a write current, is operable from greater than 0 degrees to less than 180 degrees. However, a write current is the smallest at around 45 degrees. Though the first magnetic body is provided nearer to the third magnetic body compared with the pinned layer in the present exemplary embodiment, a configuration in which the pinned layer is nearer to the third magnetic body is also possible.

According to the present invention as described above, a magnetic storage device with a small write current can be obtained and variation in write can be reduced, making it possible to provide a low-power-consumption magnetic storage device.

According to the present invention, a switching field of a magnetic body of a magnetoresistive storage element can be small and effect to variation in switching fields due to variation in shapes can be reduced.

It is obvious that the present invention is not limited to the above exemplary embodiments and that the exemplary embodiments may appropriately be changed within the scope of the technical idea of the present invention.

The present application is the National Phase of PCT/JP2008/058924, filed May 15, 2008, which is based upon Japanese Patent Application No. 2007-140176 filed on 28 May, 2007, and claims the benefit of priority from this application, the disclosure of which is incorporated herein by reference.

The invention claimed is:

1. A magnetic storage device comprising:
   a laminated structure configured to include a first magnetic body, a nonmagnetic body, and a second magnetic body which are laminated; and
   a third magnetic body configured to be provided at any of a side of said first magnetic body and a side of said second magnetic body,
   wherein resistance of said laminated structure is changed based on a difference between magnetization directions of said first magnetic body and said second magnetic body,
   a projection of one magnetic body of said first magnetic body and said third magnetic body onto another magnetic body of said first magnetic body and said third magnetic body at least partly overlaps said another magnetic body,
   said another magnetic body and said one magnetic body are magnetically coupled, a planar shape of said another magnetic body is a shape that is long in a first direction, a length of said one magnetic body is shorter than a length of said first magnetic body in said first direction, and an aspect ratio of a length of a long-axis direction of said planar shape of said another magnetic body divided by a length of a short-axis direction is greater than an aspect ratio of a length of a long-axis direction of a planar shape of said one magnetic body divided by a length of a short-axis direction, wherein a magnetization direction of said third magnetic body is variable, and wherein the first magnetic body and the third magnetic body are free layers.

2. The magnetic storage device according to claim 1, wherein a long shape magnetic body, which is one of said first magnetic body and said second magnetic body and of which said length in said first direction is relatively long, and a short shape magnetic body, which is another of said first magnetic body and said second magnetic body and of which said length in said first direction is relatively short, have a relation that a magnetization direction switching field of said long shape magnetic body when a magnetic field is applied in a long-axis direction of said long shape magnetic body is greater than a magnetization direction switching field of said short shape magnetic body when said magnetic field is applied in a long-axis direction of said short shape magnetic body.

3. The magnetic storage device according to claim 1, wherein a long shape magnetic body, which is one of said first magnetic body and said second magnetic body and of which said length in said first direction is relatively long, and a short shape magnetic body, which is another of said first magnetic body and said second magnetic body and of which said length in said first direction is relatively short, have a relation that an anisotropic magnetic field of said long shape magnetic body is greater than an anisotropic magnetic field of said short shape magnetic body.

4. The magnetic storage device according to claim 1, wherein said laminated structure stores data based on a relative relation between a magnetization direction of said first magnetic body and a magnetization direction of said second magnetic body, and said magnetization direction of said second magnetic body is directed to a desired direction when said data is read.

5. The magnetic storage device according to claim 1, wherein a planer shape of said second magnetic body is a same shape as said planer shape of said first magnetic body, or is a shape including a whole of said planer shape of said first magnetic body.

6. The magnetic storage device according to claim 1, wherein in a direction different from said long-axis direction of said planar shape of said another magnetic body, a length of said planer shape of said one magnetic body is shorter than a length of said planer shape of said another magnetic body.

7. The magnetic storage device according to claim 1, wherein said long-axis direction of said planar shape of said first magnetic body is different from said long-axis direction of said planar shape of said third magnetic body.

8. The magnetic storage device according to claim 1, wherein said long-axis direction of said planar shape of said first magnetic body is a same as said long-axis direction of said planar shape of said third magnetic body.

9. The magnetic storage device according to claim 1, wherein said first magnetic body is any of a single magnetic body layer, a plurality of magnetic body layers, and a plurality of magnetic body layers in which each of nonmagnetic conductors is provided between two magnetic body layers antiferromagnetically or ferromagnetically-coupled with each other.

10. The magnetic storage device according to claim 1, wherein said second magnetic body is any of a single magnetic body layer, a plurality of magnetic body layers, and a plurality of magnetic body layers in which each of nonmagnetic conductors is provided between two magnetic body layers antiferromagnetically or ferromagnetically-coupled with each other.

11. The magnetic storage device according to claim 1, wherein said third magnetic body is any of a single magnetic body layer, a plurality of magnetic body layers, and a plurality of magnetic body layers in which each of nonmagnetic conductors is provided between two magnetic body layers antiferromagnetically or ferromagnetically-coupled with each other.

12. The magnetic storage device according to claim 1, wherein said third magnetic body has a configuration in which a plurality of magnetic body layers in which each of nonmagnetic conductors is provided between two magnetic body layers antiferromagnetically or ferromagnetically-coupled with each other, at least one set composed of a magnetic body, a nonmagnetic body, and a magnetic body of said third magnetic body antiferromagnetically-couples said magnetic bodies, said third magnetic body has a film configuration in which an entire magnetic amount is approximately zero, magnetization directions of said at least one set come off an opposite directions by a magnetic field smaller than a switching field of said first magnetic body.

13. The magnetic storage device according to claim 1, wherein an antiferromagnetic body is laminated on said second magnetic body, and both of said antiferromagnetic body and said second magnetic body are antiferromagnetically-coupled.

14. The magnetic storage device according to claim 1, wherein said nonmagnetic body is a tunnel insulator or a conductor.

15. The magnetic storage device according to claim 1, wherein said first magnetic body and said third magnetic body are ferromagnetically-coupled.

16. The magnetic storage device according to claim 1, wherein each of said first magnetic body and/or said third magnetic body includes a plurality of magnetic body layers in which each of conductors is provided between two magnetic body layers, said first magnetic body and said third magnetic body being antiferromagnetically or ferromagnetically-coupled with each other, and when a write magnetic field is applied, a magnetization direction a magnetic body in a third magnetic body side of said first magnetic body, and a magnetization direction of a magnetic body in a first magnetic body side of said third magnetic body have a relation in which a magnetic coupling direction is a direction to reduce energy.

17. The magnetic storage device according to claim 1, wherein said first magnetic body and said third magnetic body are magnetized in opposite directions to each other in a writing operation.

18. The magnetic storage device according to claim 1, wherein said first magnetic body and said third magnetic body are magnetically-coupled through fringing field.

* * * * *